US 8,258,789 B2

(12) United States Patent
Boskamp

(10) Patent No.: US 8,258,789 B2
(45) Date of Patent: Sep. 4, 2012

(54) APPARATUS AND METHOD FOR DECOUPLING MR COILS

(75) Inventor: Eddy Benjamin Boskamp, Menomonee Falls, WI (US)

(73) Assignee: General Electric Company, Schenectady, NY (US)

( * ) Notice: Subject to any disclaimer, the term of this patent is extended or adjusted under 35 U.S.C. 154(b) by 249 days.

(21) Appl. No.: 12/643,248

(22) Filed: Dec. 21, 2009

(65) Prior Publication Data
US 2011/0148415 A1 Jun. 23, 2011

(51) Int. Cl.
*G01V 3/00* (2006.01)
(52) U.S. Cl. ........................................ 324/318
(58) Field of Classification Search ........... 324/300–322
See application file for complete search history.

(56) References Cited

U.S. PATENT DOCUMENTS

| 5,256,971 A * | 10/1993 | Boskamp ............... 324/318 |
| 5,952,909 A * | 9/1999 | Umeno et al. ........... 336/192 |
| 6,437,567 B1 * | 8/2002 | Schenck et al. ......... 324/318 |
| 6,534,983 B1 * | 3/2003 | Boskamp et al. ....... 324/318 |
| 6,608,480 B1 * | 8/2003 | Weyers ................... 324/318 |
| 7,173,425 B2 | 2/2007 | Boskamp et al. |
| 7,285,957 B2 | 10/2007 | Boskamp et al. |
| 7,309,989 B2 | 12/2007 | Boskamp et al. |
| 7,382,132 B1 | 6/2008 | Mathew et al. |
| 7,449,888 B1 | 11/2008 | Malik et al. |
| 7,525,313 B2 | 4/2009 | Boskamp et al. |
| 7,592,813 B2 | 9/2009 | Boskamp et al. |
| 2003/0201774 A1 * | 10/2003 | Klinge et al. ........... 324/318 |
| 2004/0124840 A1 * | 7/2004 | Reykowski .............. 324/318 |

FOREIGN PATENT DOCUMENTS
WO WO 2006/137946 * 12/2006

* cited by examiner

*Primary Examiner* — Melissa Koval
*Assistant Examiner* — Daniel Miller
(74) *Attorney, Agent, or Firm* — Ziolkowski Patent Solutions Group, SC

(57) ABSTRACT

An apparatus includes a first RF coil integrated into a first printed circuit board (PCB) and a second RF coil integrated into the first PCB. The apparatus also includes a tuning member positioned adjacently to the first PCB and inductively coupled to the first and second RF coils, the tuning member configured to minimize a mutual inductance formed between the first and second RF coils via modification of a coupling constant between the first and second RF coils.

16 Claims, 4 Drawing Sheets

APPARATUS AND METHOD FOR DECOUPLING MR COILS

BACKGROUND OF THE INVENTION

Embodiments of the invention relate generally to MR coils and, more particularly, to an apparatus and method of decoupling MR coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Accelerated MR imaging techniques have been developed to expedite MR data acquisition thereby reducing scan time and increasing subject throughput. One known accelerated MR imaging technique is parallel imaging whereby a phased coil array samples an imaging volume. Generally, scan time reduction is achieved by under-sampling k-space and recording images simultaneously from multiple imaging or receive coils. Under-sampling generally reduces the data acquisition time and the use of multiple receive coils, such as a phased coil array, reduces wraparound caused by under-sampling. In this manner, scan time is reduced by increasing the distance of sampling positions in k-space. If an image space is under-sampled in the phase encoding direction, for example, by a factor of two, then it will take half the time to acquire the image. In this regard, every pixel in the image will represent data from two spatial points.

In a phased coil array, a plurality of coils may be arranged in a row direction and in a column direction. Typically, the coils in the column direction are overlapped to reduce a mutual inductance between the coils in the column direction. In the row direction, however, the coils are often underlapped to provide greater spatial coverage in the row direction. This underlapping typically causes neighboring elements to be coupled via mutual inductance. To counter this effect, a transformer may be introduced between neighboring coils to cancel the mutual inductance. This transformer typically has two coupled solenoids. The coupling constant between the neighboring coils can typically be adjusted via bending one or both of the primary and secondary windings of the transformer or via adjustment of a metal setscrew on the transformer. Alternatively, a trim capacitor may be coupled between the primary and secondary windings, and the trim capacitor may be adjusted to vary the coupling constant. The transformer, however, increases a build-up height and adds cost and weight to the phased coil array.

It would therefore be desirable to have an apparatus and method capable of tuning neighboring coils while reducing the build-up height, cost, and weight of a phased coil array.

BRIEF DESCRIPTION OF THE INVENTION

In accordance with one aspect of the invention, an apparatus includes a first RF coil integrated into a first printed circuit board (PCB) and a second RF coil integrated into the first PCB. The apparatus also includes a tuning member positioned adjacently to the first PCB and inductively coupled to the first and second RF coils, the tuning member configured to minimize a mutual inductance formed between the first and second RF coils via modification of a coupling constant between the first and second RF coils.

In accordance with another aspect of the invention, a method includes forming a first RF coil in a first printed circuit board (PCB), forming a second RF coil in the first PCB, and forming an inductive member. The inductive member is positioned adjacently to the first PCB such that the inductive member is inductively coupled to the first and second RF coils and such that the inductive member minimizes a mutual inductance between the first and second RF coils.

In accordance with another aspect of the invention, an apparatus includes a first plurality of RF coils formed onto a printed circuit board (PCB), each coil of the first plurality of RF coils overlapping another coil of the first plurality of RF coils. A second plurality of RF coils is included and formed onto the PCB, each coil of the second plurality of RF coils overlapping another coil of the second plurality of RF coils, wherein the second plurality of RF coils is adjacent to the first plurality of RF coils. The apparatus further includes a first plurality of tuning members, each tuning member configured to reduce a coupling of a first respective pair of coils via an inductive coupling with each coil of the first respective pair of coils. Each first respective pair of coils includes a coil of the first plurality of RF coils and a neighboring coil of the second plurality of RF coils.

Various other features and advantages will be made apparent from the following detailed description and the drawings.

BRIEF DESCRIPTION OF THE DRAWINGS

The drawings illustrate embodiments presently contemplated for carrying out embodiments of the invention.

In the drawings.

DETAILED DESCRIPTION

Figure 1:
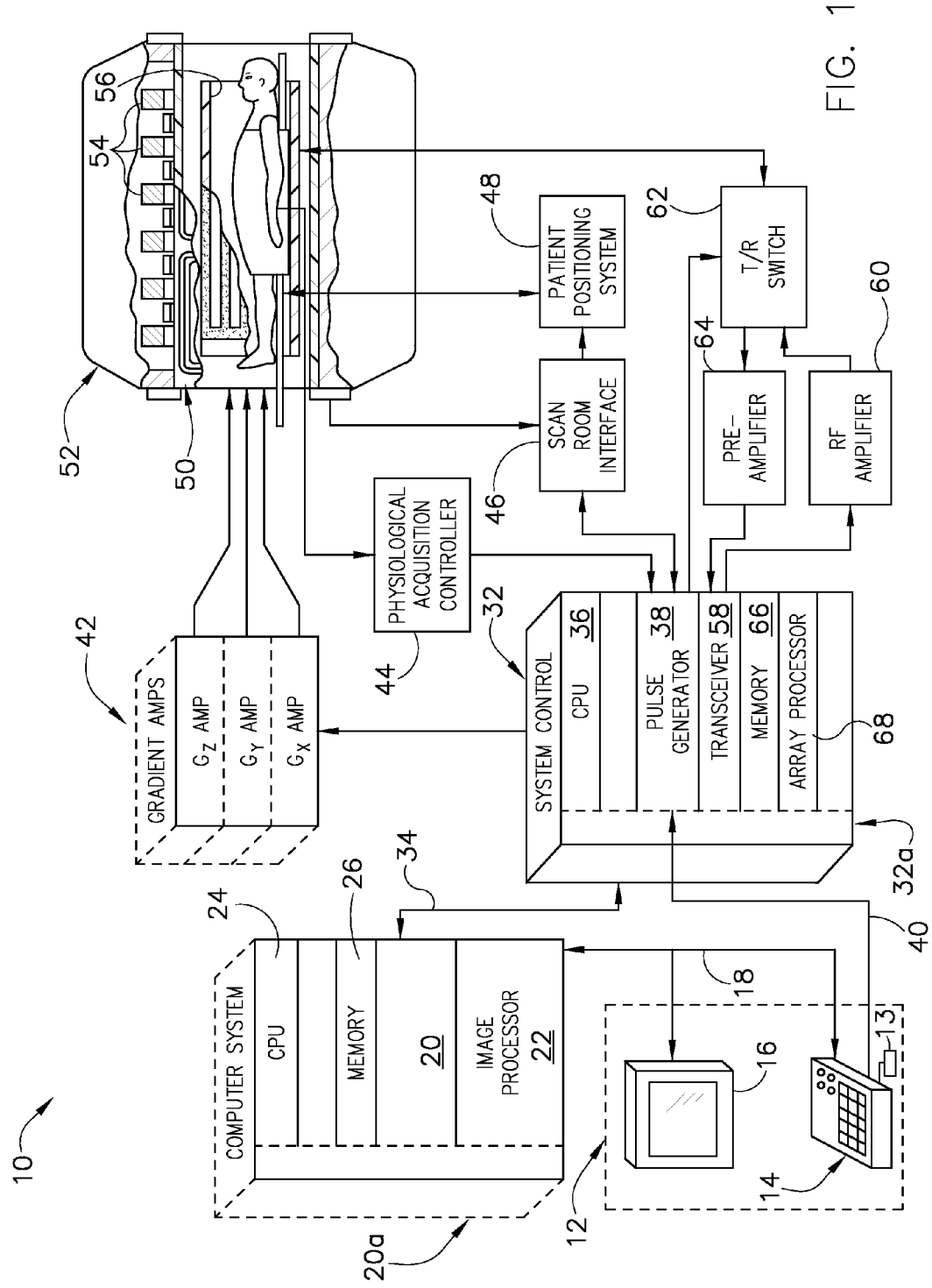
FIG. 1 is a schematic block diagram of an exemplary MR imaging system for use with an embodiment of the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
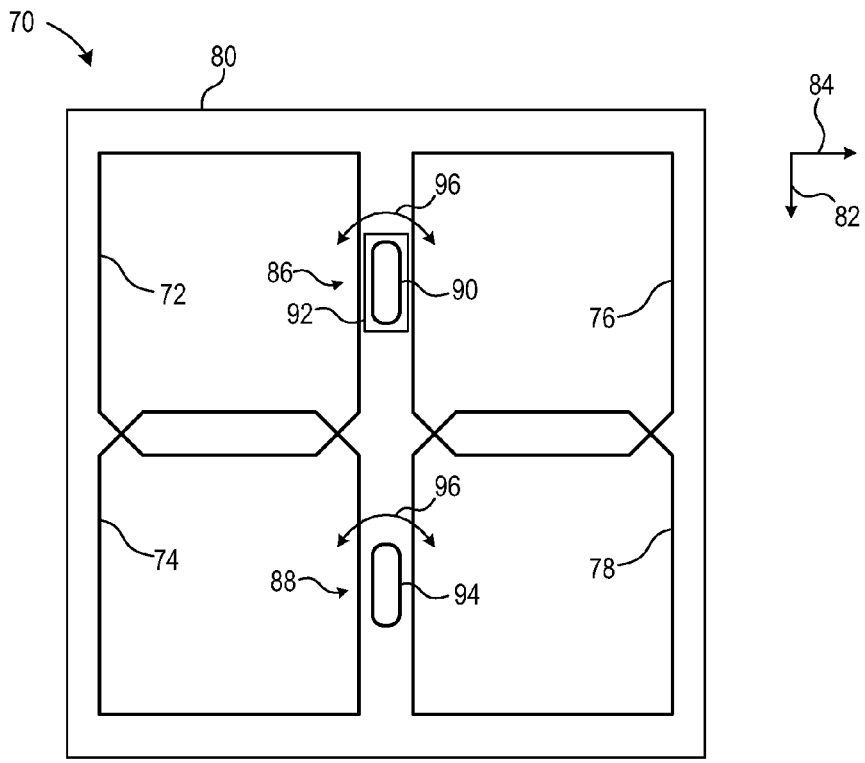
FIG. 2 is a schematic diagram of a phased array according to an embodiment of the invention.

FIG. 2 is a schematic diagram of a phased array 70 according to an embodiment of the invention. Phased array 70 includes a plurality of coils 72, 74, 76, 78 formed on or integrated into a printed circuit board 80. In one embodiment, PCB 80 is a flexible PCB and may include one or multiple layers of PCB trace material such as copper, for example. Coils 72-78 are formed on PCB 80 via a PCB formation process such as etching, for example. Coils 72, 74 form a first pair of coils, and coils 76, 78 form a second pair of coils. Coils 72, 74 are formed on PCB 80 such that they overlap each other in a column direction 82. Coils 76, 78 also overlap each other in column direction 82. The overlap of coils 72, 74 and coils 76, 78 is designed to reduce a respective mutual inductance between coil 72 and coil 74 and between coil 76 and coil 78. To provide an increased signal-to-noise ratio (SNR) in accelerated imaging, coils 72, 74 and coils 76, 78 are underlapped in a row direction 84, which may cause coils 72 and 76 and coils 74 and 78 to be coupled together via mutual inductance. Accelerated imaging includes skipping phase encoding lines in K space and extracting the information via the different spatial encoding of the signals due to the different coil element locations or orientations.

Still referring to FIG. 2, a plurality of tuning or inductive members 86, 88 is positioned adjacently to PCB 80 so as to be respectively positioned adjacently to a region between coils 72 and 76 and coils 74 and 78. In one embodiment, tuning member 86 include an electrically conductive member 90 formed on or integrated into a PCB 92. As shown in FIG. 2, conductive member 90 of tuning members 86 is a loop of electrically material formed onto PCB 92. Tuning member 88, in one embodiment, is a loop of wire 94 positioned adjacently to PCB 80. As described below, other configurations and embodiments for tuning members described herein are contemplated.

Tuning members 86, 88, in an embodiment, form transformers between respective coils and are placed directly on PCB 80 so as to reduce a build-up height of phased array 70. Tuning members 86, 88 may be translated in either the row direction 84 or the column direction 82 and may be rotated in a rotation direction 96 so as to become inductively coupled, respectively, to coils 72, 76 and to coils 74, 78. According to an embodiment of the invention, tuning members 86, 88 are translated or rotated accordingly during a tuning operation such that any mutual inductance between coils 72, 76 and coils 74, 78 is canceled or substantially eliminated. The tuning operation may include, for example, measuring the mutual inductance between coils 72 and 76 while rotating or translating tuning member 86. The rotation or translation of tuning member 86 causes a net coupling constant between coils 72 and 76 to vary. When tuning member 86 has been rotated or translated to a position causing the measured mutual inductance to be canceled or substantially eliminated, tuning member 86 may be fixed to PCB 80 with an adhesive, for example, such that it remains stationary and affixed to PCB 80. The tuning operation may be repeated for tuning member 88 in a like manner.

Figure 3:
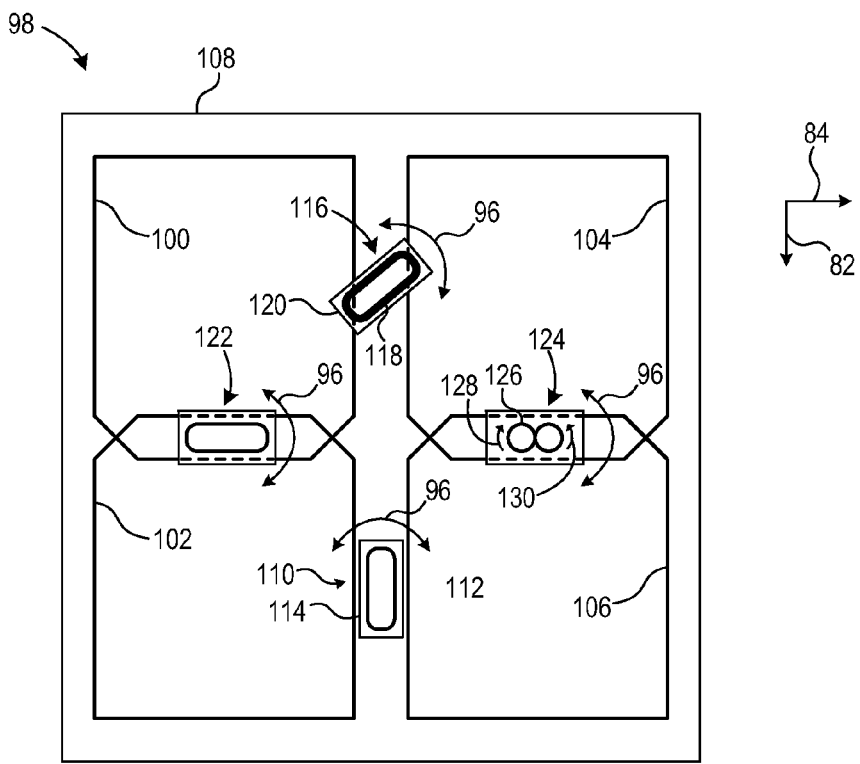
FIG. 3 is a schematic diagram of a phased array according to an embodiment of the invention.

FIG. 3 is a schematic diagram of a phased array 98 according to another embodiment of the invention. Phased array 98 includes a plurality of coils 100, 102, 104, 106 formed on a PCB 108. Similar to coils 72-78, coils 100-106 have overlap in the column direction 82 and underlap in the row direction 84. A tuning or inductive member 110 similar to tuning member 86 of FIG. 2 is shown positioned adjacently to PCB 108 so as to be inductively coupled with coils 102, 106. Tuning member 110 includes an electrically conductive member 112 formed onto a PCB 114. Tuning member 110 may be used to tune coils 102, 106 as described above.

FIG. 3 also shows a tuning or inductive member 116 positioned adjacently to PCB 108 so as to be inductively coupled with coils 100, 104 and so as to tune coils 100, 104 in the manner described above. Similar to tuning member 110, tuning member 116 includes an electrically conductive member 118 formed onto a PCB 120. Conductive member 118, however, is shown as having a greater thickness than conductive member 112.

According to an embodiment of the invention, a tuning or inductive member 122 may be positioned adjacently to coils 100, 102 to change a net coupling constant between coils 100, 102. For example, if coils 100, 102 are undercoupled, tuning member 122 may be translated or rotated to increase a coupling of coils 100, 102 to cancel or substantially eliminate any mutual inductance between coils 100, 102. Similarly, a tuning or inductive member 124 may be positioned adjacently to coils 104, 106 to change a net coupling constant between coils 104, 106. As shown, tuning member 124 includes an electrically conductive member 126 formed into a figure eight pattern, and current inductively induced in conductive member 126 as shown at arrows 128, 130 is configured to decrease a coupling of coils 104, 106 when an overcoupling of coils 104, 106 causes a mutual inductance therebetween. Rotation or translation of conductive member 126 during the tuning process reduces the overcoupling of coils 104, 106 so as to cancel or substantially eliminate any mutual inductance between coils 104, 106.

Figure 4:
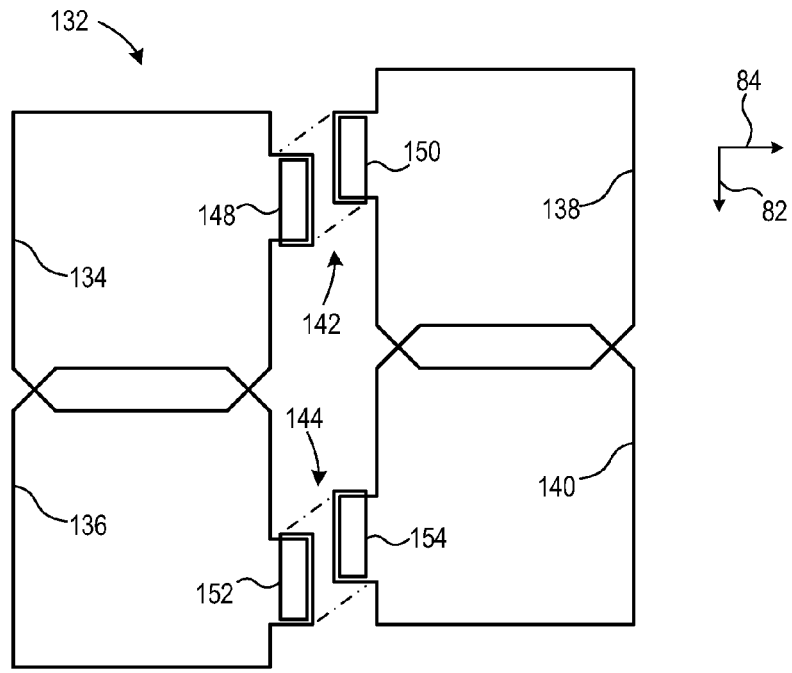
FIGS. 4 and 5 are schematic diagrams of a phased array according to embodiments of the invention.
Figure 5:
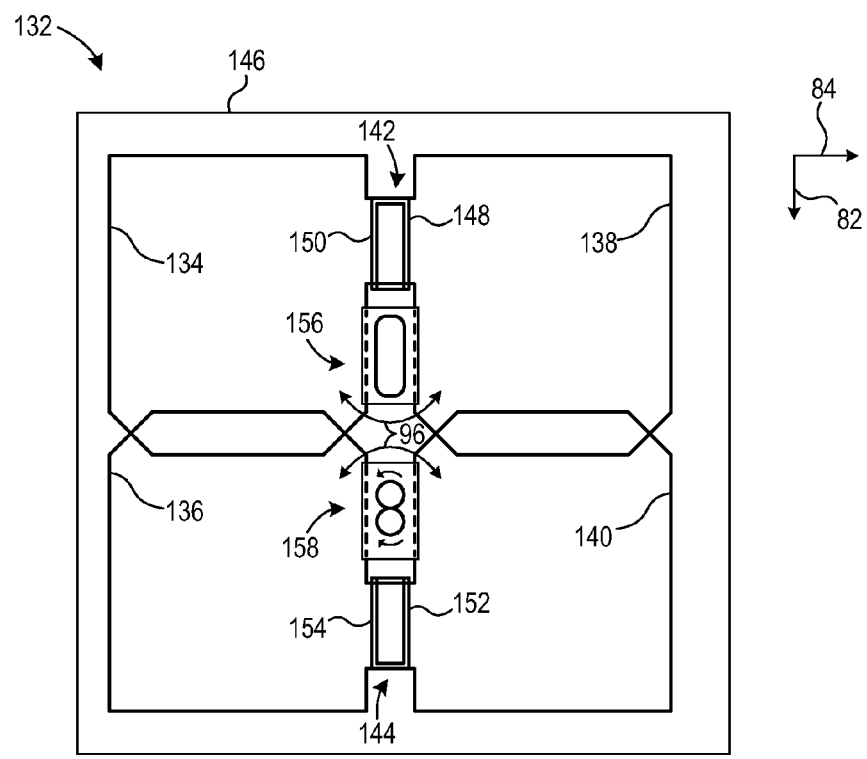

FIGS. 4 and 5 show a phased array 132 according to an embodiment of the invention. Phased array 132 includes a plurality of coils 134, 136, 138, 140 coupled to a plurality of transformers 142, 144. Phased array 132 is formed onto a PCB 146. FIG. 4 shows an exploded view of coils 134-140 and transformers 142-144. Transformer 142 includes a first or primary winding 148 coupled in series with coil 134 and a second or secondary winding 150 coupled in series with coil 138. Transformer 144 includes a first or primary winding 152 coupled in series with coil 136 and a second or secondary winding 154 coupled in series with coil 140. In an embodiment of the invention, windings 148-154 are multi-layer windings formed onto PCB 146.

As shown in FIG. 5, windings 148, 150 of transformer 142 overlap one another, and windings 152, 154 of transformer 144 overlap one another. Transformers 142, 144 are designed and formed on PCB 146 so as to reduce a mutual inductance between coils 134, 138 and coils 136, 140, respectively. In an embodiment of the invention, a plurality of tuning or inductive members 156, 158 are positioned adjacently to coils 134, 138 and coils 136, 140, respectively, to cancel or substantially eliminate any mutual inductance remaining between coils 134 and 138 and between coils 136 and 140. As illustrated, tuning member 156 is similar to tuning member 86 described above with respect to FIG. 2, and tuning member 158 is similar to tuning member 124 described above with respect to FIG. 3. Based on a rotation or a translation of tuning members 156, 158 during a tuning procedure similar to that described above, the mutual inductance remaining between coils 134 and 138 and between coils 136 and 140 may be canceled or substantially eliminated.

Figure 6:
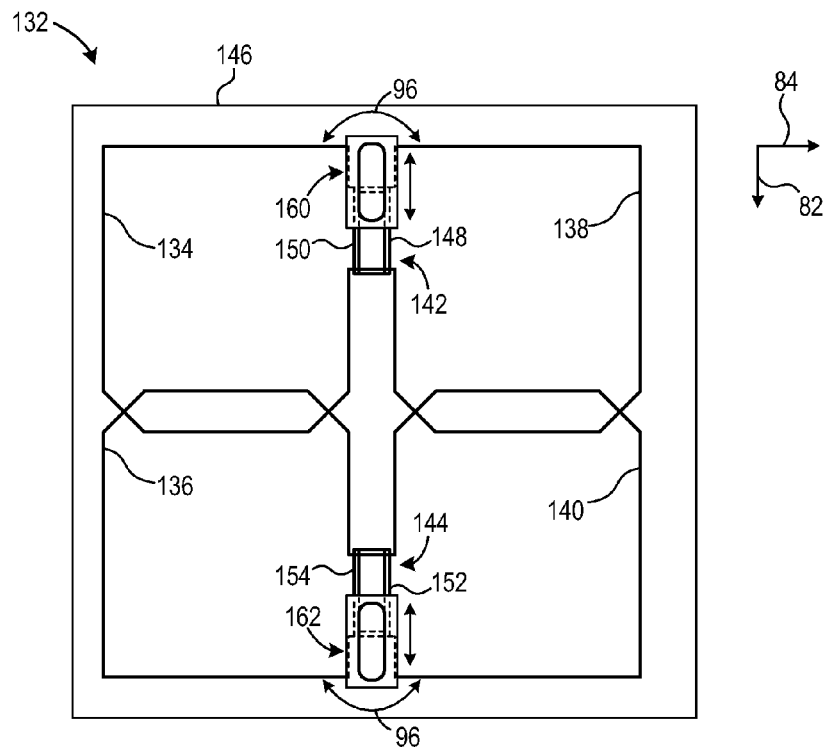
FIG. 6 is a schematic diagram of a phased array according to an embodiment of the invention.

FIG. 6 shows an embodiment of the phased array 132 of FIGS. 4 and 5 according to another embodiment of the invention. As shown in FIG. 6, each of a pair of tuning or inductive members 160, 162 similar to tuning member 156 is positioned adjacently to a respective transformer 142, 144. During a tuning process, tuning members 160, 162 may be rotated or translated adjacently to respective transformers 142, 144 to change a magnetic field pattern about transformers 142, 144 and/or to change a coupling constant affected by transformers 142, 144.

Figure 7:
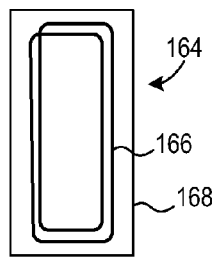
FIGS. 7-9 are schematic diagrams of a tuning member according to embodiments of the invention.
Figure 8:
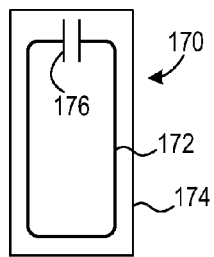
Figure 9:
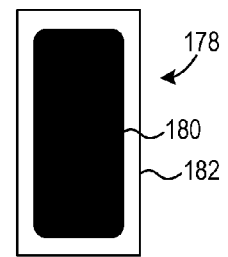

FIGS. 7-9 illustrate embodiments of tuning members according to an embodiment of the invention. The embodiments of the tuning members shown in FIGS. 7-9 as well as embodiments of the tuning members described throughout FIGS. 2-6 may be substituted one for another to achieve a greater or lesser degree of tuning adjustment sensitivity or effect. As shown in FIG. 7, a tuning or inductive member 164 includes an electrically conductive member 166 formed onto a PCB 168. Conductive member 166 is a multi-loop, multi-layer PCB trace formed onto PCB 168 to increase the adjustment sensitivity of tuning member 166. While two loops or turns are shown, it is contemplated that more than two turns may be formed.

As shown in FIG. 8, a tuning or inductive member 170 includes an electrically conductive member 172 formed onto a PCB 174. Conductive member 172 is coupled in series with a capacitor 176, which lowers an impedance of tuning member 170 and increases the adjustment sensitivity of tuning member 170. The capacitance of capacitor 176 is chosen such that tuning member 170 does not resonate at the same frequency as the coils to which it is inductively coupled. As shown in FIG. 9, a tuning or inductive member 178 includes an electrically conductive member 180 formed onto a PCB 182. Conductive member 180 comprises a solid area of electrically conductive material such as copper foil, for example.

According to embodiments of the invention, embodiments of the tuning members described herein may be combined. For example, the conductive member 172 of tuning member 170 may formed into a multi-turn, multi-layer coil (such as that shown in FIG. 7) coupled in series with capacitor 176. Other combinations of tuning members are also contemplated.

Therefore, according to an embodiment of the invention, an apparatus includes a first RF coil integrated into a first printed circuit board (PCB) and a second RF coil integrated into the first PCB. The apparatus also includes a tuning member positioned adjacently to the first PCB and inductively coupled to the first and second RF coils, the tuning member configured to minimize a mutual inductance formed between the first and second RF coils via modification of a coupling constant between the first and second RF coils.

According to another embodiment of the invention, a method includes forming a first RF coil in a first printed circuit board (PCB), forming a second RF coil in the first PCB, and forming an inductive member. The inductive member is positioned adjacently to the first PCB such that the inductive member is inductively coupled to the first and second RF coils and such that the inductive member minimizes a mutual inductance between the first and second RF coils.

According to yet another embodiment of the invention, an apparatus includes a first plurality of RF coils formed onto a printed circuit board (PCB), each coil of the first plurality of RF coils overlapping another coil of the first plurality of RF coils. A second plurality of RF coils is included and formed onto the PCB, each coil of the second plurality of RF coils overlapping another coil of the second plurality of RF coils, wherein the second plurality of RF coils is adjacent to the first plurality of RF coils. The apparatus further includes a first plurality of tuning members, each tuning member configured to reduce a coupling of a first respective pair of coils via an inductive coupling with each coil of the first respective pair of coils. Each first respective pair of coils includes a coil of the first plurality of RF coils and a neighboring coil of the second plurality of RF coils.

This written description uses examples to disclose embodiments of the invention, including the best mode, and also to enable any person skilled in the art to practice embodiments of the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
   a first RF coil integrated into a first printed circuit board (PCB);
   a second RF coil integrated into the first PCB; and
   an adjustable tuning member positioned adjacently to the first PCB and inductively coupled to the first and second RF coils, the adjustable tuning member configured to minimize a mutual inductance formed between the first and second RF coils via modification of a coupling constant between the first and second RF coils, wherein the adjustable tuning member comprises an electrically conductive material integrated into a second PCB, and wherein the second PCB is adjustably affixed to the first PCB such that the second PCB can be rotated or translated with respect to the first PCB to position the adjustable tuning member adjacently to a region between the first and second RF coils so as to minimize the mutual inductance between the first and second RF coils.

2. The apparatus of claim 1 wherein the electrically conductive material is formed into a loop.

3. The apparatus of claim 2 wherein the loop comprises a plurality of turns formed on multiple layers of the second PCB.

4. The apparatus of claim 2 further comprising a capacitor coupled in series with the loop.

5. The apparatus of claim 1 wherein the tuning member comprises a layer of copper foil.

6. The apparatus of claim 1 wherein the tuning member is configured to reduce a coupling of the first and second RF coils.

7. The apparatus of claim 1 wherein the tuning member is configured to increase a coupling of the first and second RF coils.

8. The apparatus of claim 1 wherein the tuning member is positioned adjacently to the transformer.

9. The apparatus of claim 8 wherein the tuning member overlaps a portion of the transformer.

10. The apparatus of claim 1 further comprising a transformer integrated into the first PCB between the first and second RF coils, the transformer comprising:
    a first winding coupled in series with the first RF coil; and
    a second winding coupled in series with the second RF coil.

11. A method comprising:
    forming a first RF coil in a first primed circuit board (PCB);
    forming a second RF coil in the first PCB;
    forming an adjustable inductive member, wherein forming the adjustable inductive member comprises forming the adjustable inductive member on a second PCB that is adjustably affixed to the first PCB;
    rotating or translating the second PCB with respect to the first PCB to position the adjustable inductive member adjacently to a region between the first and second RF coils such that the adjustable inductive member is inductively coupled to the first and second RF coils and such that the adjustable inductive member minimizes a mutual inductance between the first and second RF coils; and
    affixing the second PCB to the first PCB at a position for which mutual inductance between the first and second RF coils is minimized.

12. The method of claim 11 further comprising:
    forming a first transformer winding in the first PCB and in the region between the first and second RF coils, the first transformer winding serially coupled to the first RF coil;
    forming a second transformer winding in the first PCB and in the region between the first and second RF coils, the second transformer winding serially coupled to the second RF coil and overlapping the first transformer winding, wherein the first and second transformer windings form a transformer;
    wherein positioning the inductive member adjacently to the region between the first and second RF coils comprises positioning the inductive member adjacently to the transformer; and
    tuning the inductive coupling of the first and second RF coils to vary an amount of overlap between the inductive member and the transformer such that an inductive coupling of the first and second RF coils is substantially eliminated.

13. An apparatus comprising:
    a first plurality of RF coils formed onto a first printed circuit board (PCB), each coil of the first plurality of RF coils overlapping another coil of the first plurality of RF coils in a first overlapping direction;
    a second plurality of RF coils formed onto the first PCB, each coil of the second plurality of RF coils overlapping another coil of the second plurality of RF coils in the first overlapping direction, wherein the second plurality of RF coils is adjacent to the first plurality of RF coils, and wherein the second plurality of RF coils is underlapped from the first plurality of RF coils in a second direction orthogonal to the first overlapping direction; and
    a first plurality of adjustable tuning members, each adjustable tuning member formed onto a distinct PCB and configured to reduce a coupling of a first respective pair of coils via an inductive coupling with each coil of the first respective pair of coils, wherein each first respective pair of coils comprises:
    a coil of the first plurality of RF coils; and
    a neighboring coil of the second plurality of RF coils;
    wherein each distinct PCB is adjustably affixed to the first PCB such that the each distinct PCB can be rotated or translated with respect to the first PCB to position the corresponding adjustable tuning member adjacently to a region between the corresponding first respective pair of coils so as to reduce the coupling of the first respective pair of coils.

14. The apparatus of claim 13 further comprising:
    a plurality of transformers coupled to the first and second plurality of RF coils, each of the first respective pair of coils coupled to a respective transformer of the plurality of transformers, wherein each transformer is formed onto the PCB and comprises:
    a first winding serially coupled with one of the first respective pairs of coils; and
    a second winding serially coupled with the other of the first respective pairs of coils, wherein the first and second windings overlap each other.

15. The apparatus of claim 14 wherein each tuning member of the first plurality of tuning members is positioned adjacently to a respective transformer of the plurality of transformers.

16. The apparatus of claim 13 further comprising a second plurality of tuning members, each tuning member of the second plurality of tuning members configured to reduce a coupling of a second respective pair of coils via an inductive coupling with each coil of the second respective pair of coils, wherein each second respective pair of coils comprises:
   a first coil of one of the first and second plurality of RF coils; and
   a second coil of the one of the first and second plurality of RF coils, were the first and second coils overlap.

* * * * *

UNITED STATES PATENT AND TRADEMARK OFFICE
CERTIFICATE OF CORRECTION

| | | |
|---|---|---|
| PATENT NO. | : 8,258,789 B2 | |
| APPLICATION NO. | : 12/643248 | |
| DATED | : September 4, 2012 | |
| INVENTOR(S) | : Boskamp | |

It is certified that error appears in the above-identified patent and that said Letters Patent is hereby corrected as shown below:

In Column 7, Line 57, in Claim 11, delete "primed" and insert -- printed --, therefor.

In Column 10, Line 6, in Claim 16, delete "were" and insert -- where --, therefor.

Signed and Sealed this
Twenty-ninth Day of January, 2013

David J. Kappos
*Director of the United States Patent and Trademark Office*